United States Patent [19]

Saito et al.

[11] 4,232,238
[45] Nov. 4, 1980

[54] RECTIFIER ASSEMBLY FOR AC GENERATORS FOR USE WITH VEHICLES

[75] Inventors: Akihiro Saito; Keigo Naoi, both of Katsuta, Japan

[73] Assignee: Hitachi, Ltd., Japan

[21] Appl. No.: 17,899

[22] Filed: Mar. 6, 1979

[30] Foreign Application Priority Data

Mar. 6, 1978 [JP] Japan .................. 53/24520

[51] Int. Cl.³ .......................... H02K 11/00
[52] U.S. Cl. .................... 310/68 D; 363/145
[58] Field of Search .......... 310/68 R, 68 D; 363/144, 145

[56] References Cited

U.S. PATENT DOCUMENTS

| | | | |
|---|---|---|---|
| 3,641,374 | 2/1972 | Sato .................. | 310/68 D |
| 3,777,193 | 12/1973 | Buehner ............. | 310/68 D |
| 3,812,390 | 5/1974 | Richards ............ | 310/68 D |
| 3,870,944 | 3/1975 | Ogawa et al. ....... | 310/68 D X |
| 3,959,676 | 5/1976 | Striker .............. | 310/68 D |

FOREIGN PATENT DOCUMENTS 2350317  4/1975  Fed. Rep. of Germany ........ 310/68 D Primary Examiner—Mark O. Budd
Attorney, Agent, or Firm—Craig & Antonelli

[57] ABSTRACT

There is disclosed a rectifier assembly for an AC generator for use with vehicles. The rectifier assembly comprises a single horseshoe heat radiating plate and electric circuit elements mounted thereon, and including at least one rectifier unit and two DC output conductor plates. The two d.c. output conductor plates are disposed in spaced relationship on one surface of the heat radiating plate with an intermediate insulating layer and electrically connected to output terminals of the rectifier unit. The assembly may be incorporated with a voltage regulator of an integrated circuit configuration for controlling the output voltage of the AC generator and a brush holder. The voltage regulator may be co-planar with the conductor plates.

4 Claims, 11 Drawing Figures

RECTIFIER ASSEMBLY FOR AC GENERATORS FOR USE WITH VEHICLES

BACKGROUND OF THE INVENTION

1. Field of the Invention

The present invention relates to a rectifier assembly for an AC generator for use with vehicles and more particularly to a rectifier assembly having a construction suitable for being built into an AC generator for use with automobiles.

2. Description of the Prior Art

In a conventional rectifier assembly built into an AC generator for use with vehicles as shown in Japanese Utility Model Publication No. 7131/72, the rectifiers are connected through electrically conductive thin plates fixed by thermo-compression bonding to an insulating base plate provided on a heat radiating plate thereby to economize and simplify the wiring of the rectifiers. But automobiles generally allow only a small space for mounting the AC generator so that the generator is required to be miniaturized so that it may be contained in such a small space in an automobile. Although the aforementioned structure dispenses with lead wires for interconnecting electrodes of the rectifiers it is required to form a layer of pre-impregnated material, referred to hereinafter as "prepreg", to hermetically seal the rectifiers made of semiconductor material because the rectifiers would otherwise be exposed to the exterior. Thus, the whole rectifier assembly is necessarily made to have a thickness of 5 to 10 mm and cannot be satisfactorily miniaturized. In addition, the heat radiating plate is made of two arcuate radiating members juxtaposed on the same plane with interposition of an insulating base plate and a metal plate in the form of a horseshoe configuration and hence is not so strong mechanically as may be used under severe operating conditions as in vehicles. For these reasons, there is a great demand for a compact, strong and easy-to-handle rectifier assembly.

SUMMARY OF THE INVENTION

An object of the present invention is to provide a rectifier assembly for an AC generator for use in vehicles which is compact, simplified and has a high resistance against vibrations.

The present invention is featured in that on a heat radiating plate formed into a horseshoe configuration and fixed to an inner wall of an end bracket connected to the stator of the AC generator, there are mounted two spaced conductor plates and a set of rectifier units disposed between the conductor plates with an intermediate insulating layer insulating the conductor plates and the rectifier units from the radiating plate and that the electrodes of the rectifier units are electrically connected to the conductor plates. This structure is attributable to the provision of a rectifier assembly for an AC generator for use with vehicles which is thin, resistive against vibration and easy to handle.

In a preferred embodiment of the invention, each of the rectifier units includes at least one main rectifier element connected to one of the conductor plates and a suitable number of auxiliary rectifier elements connected to the other conductor plate, and there is further mounted on the radiating plate a voltage regulator in the form of an integrated circuit which is connected between the two conductor plates.

DESCRIPTION OF THE PREFERRED EMBODIMENTS

Figure 1:
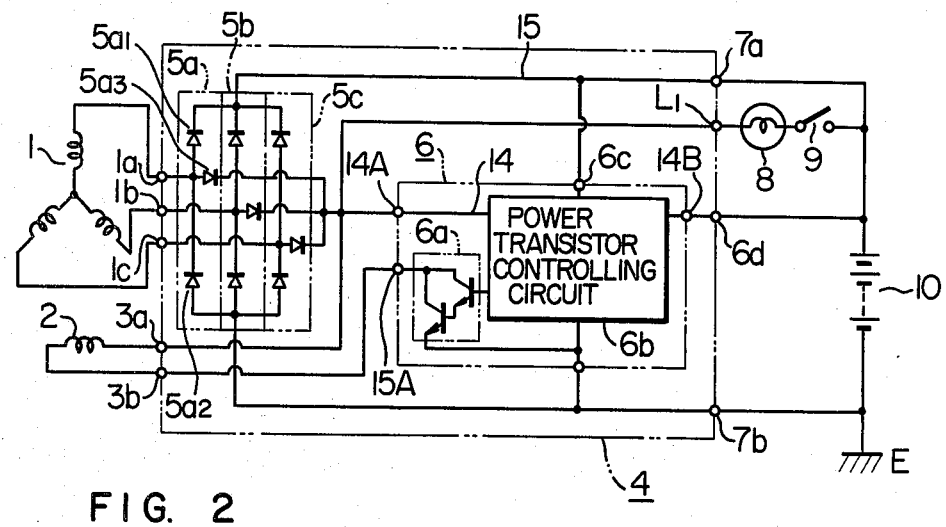
FIG. 1 is a circuit diagram of one embodiment of the invention.

Now, a preferred embodiment of the present invention will be explained with reference to FIGS. 1 and 2 which show the circuit connection and the structure of an AC generator incorporated with a rectifier assembly of the present invention. The AC generator includes a stator having a Y-connection armature coil 1 wound thereon, a rotor having magnetic poles on which a field coil 2 is wound for exciting the generator and a brush holder 3 carrying brushes 3a and 3b through which an exciting current is supplied to the field coil. The rectifier assembly 4 comprises a rectifier circuit including rectifier units 5a, 5b and 5c and receives the AC outpt of the AC generator at input terminals 1a, 1b and 1c to produce a rectified DC output. Generally, the rectifier assembly further comprises a control unit including a voltage regulator 6 in the form of an integrated circuit which is adapted to control the AC output of the generator for maintaining the DC output voltage substantially constant.

The voltage regulator 6 comprises a power transistor 6a for on-off switching the exciting current of the field coil 2, and a power transistor controlling circuit 6b having voltage detecting terminals 6c and 6d. Terminals 7a and 7b for d.c. output of the rectifier, serving as mounting bolts, are connected to a storage battery 10 as an electric load which is carried by a vehicle. In the generator exciting circuit is connected a charge lamp 8 in series with a key switch 9, which lamp ceases to emit light to indicate that the generator is in effect, when the output voltage of the generator rises after the initial excitation so that no potential difference appears across the lamp.

Figure 2:
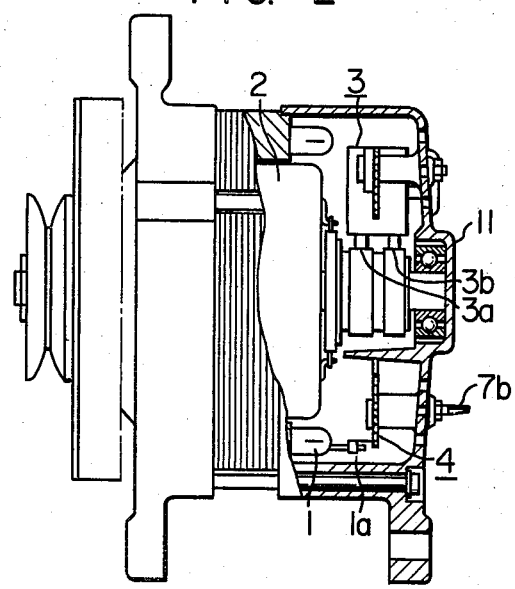
FIG. 2 is a partially broken side view of an a.c. generator to which the invention is applied.

The rectifier assembly 4 shown in FIG. 1 and the brush holder 3 are mounted to the inner wall of an end bracket 11 of the generator through a heat radiating plate 12 of the assembly as shown in FIG. 2 with the input terminals 1a, 1b and 1c connected to the armature coil 1.

Figure 3:
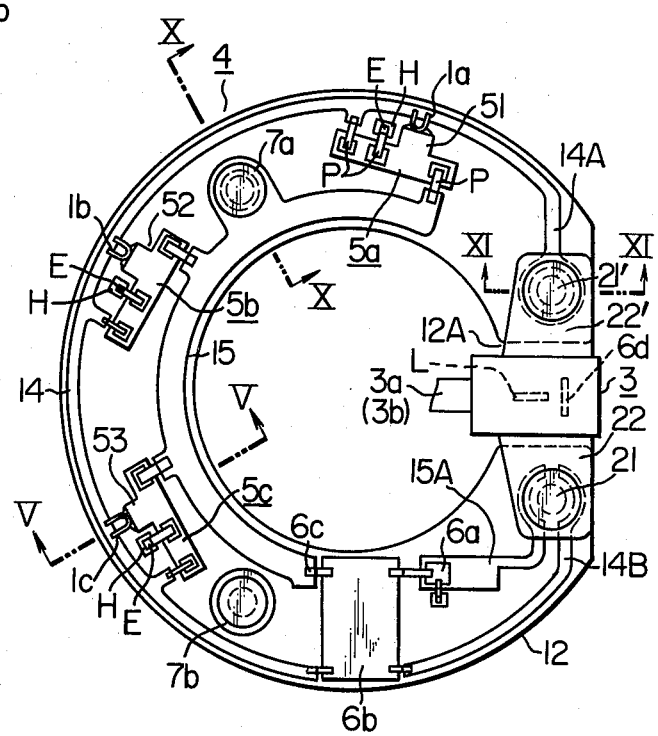
FIG. 3 is a plan view of a rectifier assembly of the invention.
Figure 4:
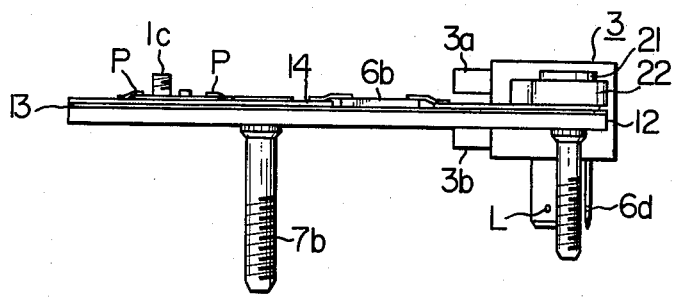
FIG. 4 is a side view of the rectifier assembly in FIG. 3.
Figure 5:
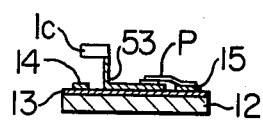
FIG. 5 is a sectional view taken along V—V line in FIG. 3.

Referring to FIGS. 3 and 4, a construction of the rectifier assembly 4 will be described in more detail.

Figure 6:
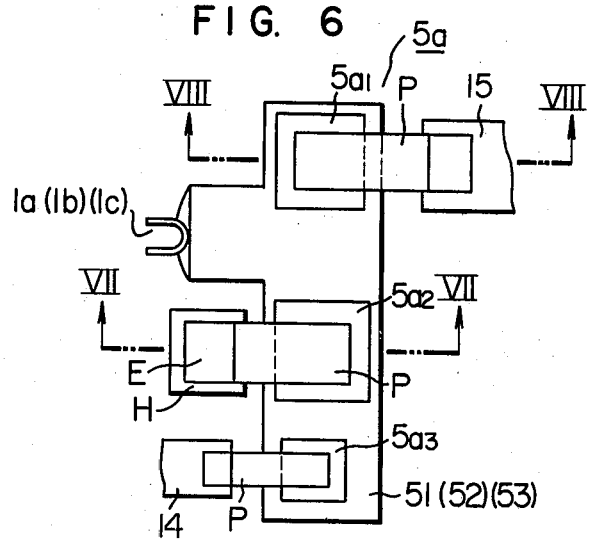
FIG. 6 is an enlarged view of one of the rectifier units shown in FIG. 3.
Figure 7:
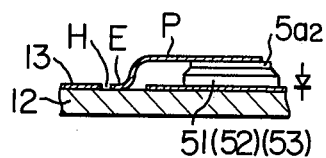
FIG. 7 is a sectional view taken along VII—VII line in FIG. 6.
Figure 8:
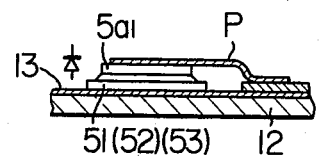
FIG. 8 is a sectional view taken along VIII—VIII line in FIG. 6.
Figure 9:
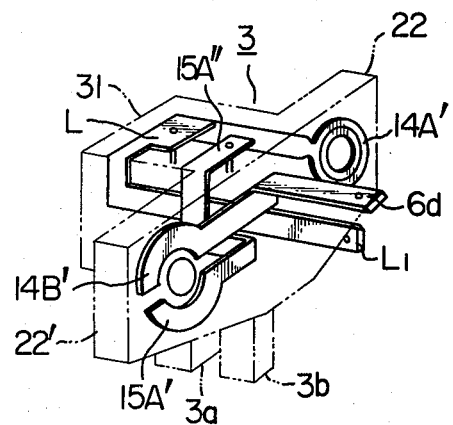
FIG. 9 is a perspective view of the brush holder.
Figure 10:
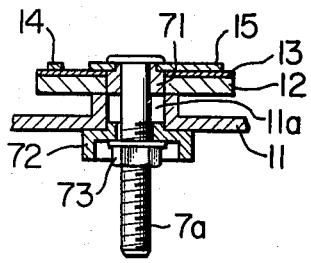
FIGS. 10 and 11 are sectional views along X—X and XI—XI in FIG. 3, respectively.
Figure 11:
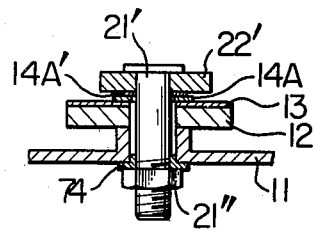

As diagrammatically shown in FIG. 3, the heat radiating plate 12 is made of a metallic plate having good heat conductivity such as a plate of aluminum, copper or the like and is formed into a horseshoe configuration with a gap 12A. On one surface of the heat radiating plate is formed a heat resistive, thin insulating layer 13. The insulating layer is made of, for example, prepreg such as glass fibers immersed with an adhesive of thermosetting epoxy resin and formed into a sheet of substantially the same configuration as that of the radiating plate. This sheet is formed with through holes H at portions where the earth-connections are made. An arcuate common conductor plate 14 of a width of 2 to 3 mm is disposed on the insulating layer 3 along the outer periphery of the heat radiating plate. One end 14A of the conductor plate is extends close to one side of the gap 12A of the radiating plate and the other end 14B also extends close to the opposite side of the gap. The conductor plate is separated into two parts, between which there is connected a power transistor control circuit 6b. Another arcuate conductor plate 15 of a width of 5 mm extends along the inner periphery of the heat radiating plate with a lip portion serving as the d.c. output terminal 7a. One end of the conductor plate 15 is extends, like the conductor plate 14, close to the opposite side of the gap 12A of the heat radiating plate. The conductor plate 15 is also separated into two parts, between which there is connected the power transistor control circuit 6b. The conductor plates 14 and 15 are electrically insulated from each other except for the connection through the control circuit 6b. Both the conductor plates 14 and 15 are firmly secured to the insulating layer 13 by thermal pressure bonding. Then, the rectifier units 5a, 5b and 5c are disposed between the common conductor plates 14 and 15 in a manner as will be described hereinafter. The rectifier units 5a, 5b and 5c are arranged on electrically conductive base plates 51, 52 and 53, respectively, each being fixed to the insulating layer 13 by adhesive and having an input terminal 1a (or 1b, 1c). Each rectifier unit includes three rectifier elements $5a_1$, $5a_2$ and $5a_3$ fixed to the base plate. The rectifier elements $5a_1$ and $5a_2$ constitute the main rectifier circuit, of which one terminal is connected through the through hole H to the earth, and the other terminal is connected to the conductor plate 15 having another DC terminal 7a. The remaining rectifier element $5a_3$ is an auxiliary rectifier element, of which the terminal is connected to the conductor plate 14. As will be better understood from FIGS. 6 to 8, the three rectifier elements 5 are soldered to the base plate 51 (52, 53). FIG. 8 shows a sectional view of the main rectifier element along VIII—VIII in FIG. 6 and FIG. 7 shows a sectional view of the auxiliary rectifier element along VII—VII in FIG. 6. The power transistor controlling circuit 6b disposed between the common conductor plates 14 and 15 and connected to the power transistor 6a is made into the form of an integrated circuit on a ceramic substrate which is firmly secured by adhesive to the upper surface of the insulating layer. The transistor circuit 6a is secured to the common conductor plate 15A and one terminal is grounded. The brush holder 3 made of an insulating material is mounted at the gap 12A of the heat radiating plate 12. As shown in FIG. 9, the brush holder 3 comprises a section 31 for holding the brushes 3a and 3b and a molding insulator having a pair of wing portions 22 and 22' as shown in FIG. 9. On the wing portion 22 is mounted an auxiliary conductor plate 14A' while on the wing portion 22' are mounted an auxiliary conductor plates 15A' an auxiliary conductor plate 14B' which are insulated from each other. The auxiliary conductor plate 14A' is connected to the brush 3a and also through a conductor plate L to an external terminal, while the auxiliary conductor plate 15A' is connected to the brush 3b. The auxiliary conductor plate 14B' is integrally connected to an external terminal 6d. The brush holder as above mentioned is fixed to the heat radiating plate 12, as shown in FIG. 10 such that the auxiliary conductor plates 14A', 14B' and 15A' are in contact with the conductor plates 14A, 14B and 15A, respectively and secured in together to the housing 11 by bolts 21' and nuts 21".

The interconnections between the above-mentioned electronic parts except for the brush holder are made by soldered connecting chips P. The output terminal 7b, the emitter of the power transistor 6a and the earth sides of the rectifier units are connected to the heat radiating plate 12 by means of the through holes of the insulating layer 13. The rectifier assembly 4, thus formed, including the rectifier units is fixed to the inside of the end bracket 11 of the AC generator through bolts 7a and 7b. The bolt 7a is insulated by an insulating bush 71 from the radiating plate 12, as shown in FIG. 10, and further pressed into a mounting hole 11a of the end bracket 11. The bolt 7a is secured to the end bracket 11 through another insulating bushing 72 and a nut 73. These bolts serve as the output terminals 7a and 7b, and the one serving as the output terminal 7a is insulated from the heat radiating plate by an insulating bushing, while the other bolts serving as the output terminal 7b is electrically connected to the heat radiating plate and the end bracket thereby effecting the earth connection.

With the above-mentioned structure, the electronic parts are integrated on a single heat radiating plate and simply connected by the two common conductor plates, thereby ensuring easy fabricating and improved productivity. The brush holder which can be mechanically fixed to the heat radiating plate and electrically connected to the conductor plates by simply tightening screws is effective to simplify its assembly, exchange and maintenance. The integration of the circuit elements is effective not only to make the thickness of the heat radiating plate thinner but also to decrease the axial length of the generator.

We claim:

1. A rectifier assembly for an AC generator to be mounted in vehicles comprising;
    a heat radiating metallic plate of a horseshoe configuration, whose one surface is covered by an insulating layer,
    a pair of electrically conductive plates fixed on said insulating layer of said heat radiating plate and spaced from each other to give a space therebetween,
    a semiconductor rectifier unit for rectifying an AC output of the AC generator to produce a DC output, said rectifier unit being mounted to said heat radiating plate at the space between said conductive plates,
    said rectifier unit including at least one main rectifier element whose output terminal is connected to one of said conductive plates and an auxiliary rectifier element whose output terminal is connected to the other conductive plate, and
    means for fixing said heat radiating plate to the AC generator.

2. A rectifier assembly according to claim 1 further comprising a voltage regulator formed into a semiconductor integrated circuit configuration and disposed at the space between said conductive plates.

3. A rectifier assembly according to claim 1 wherein said conductive plates are each formed into an arcuate configuration and said one conductive plate is extending along the inner periphery of said heat radiating plate, while said other conductive plate is extending along the outer periphery of said heat radiating plate.

4. A rectifier assembly according to claim 1 wherein said fixing means comprises a first bolt adapted to secure said heat radiating plate to the AC generator by an aid of a nut so as to provide an electrical connection between said heat radiating plate and said one conductive plate, and a second bolt studded to said heat radiating plate.

* * * * *